United States Patent
Wei et al.

(10) Patent No.: US 7,933,125 B2
(45) Date of Patent: Apr. 26, 2011

(54) BOARD UNIT AND ELECTRONIC APPARATUS

(75) Inventors: Jie Wei, Kawasaki (JP); Keizou Takemura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 44 days.

(21) Appl. No.: 12/369,213

(22) Filed: Feb. 11, 2009

(65) Prior Publication Data
US 2009/0237883 A1    Sep. 24, 2009

(30) Foreign Application Priority Data

Mar. 24, 2008    (JP) .................................. 2008-075622

(51) Int. Cl.
*H05K 7/20* (2006.01)
(52) U.S. Cl. ...... 361/699; 165/80.2; 165/80.4; 165/185; 361/704; 361/708; 361/719
(58) Field of Classification Search .................. 361/699, 361/719
See application file for complete search history.

(56) References Cited

U.S. PATENT DOCUMENTS

| | | | | |
|---|---|---|---|---|
| 5,057,968 A * | 10/1991 | Morrison | ...................... | 361/700 |
| 6,421,240 B1 * | 7/2002 | Patel | .............................. | 361/699 |
| 6,424,532 B2 * | 7/2002 | Kawamura | .................... | 361/708 |
| 6,496,375 B2 * | 12/2002 | Patel et al. | ..................... | 361/719 |
| 6,934,152 B1 * | 8/2005 | Barrow | ......................... | 361/690 |
| 7,365,990 B2 * | 4/2008 | RaghuRam | ................... | 361/720 |
| 7,460,373 B2 * | 12/2008 | Nagahashi | .................... | 361/704 |
| 2006/0221573 A1 * | 10/2006 | Li | ................................. | 361/704 |

FOREIGN PATENT DOCUMENTS

| | | |
|---|---|---|
| JP | 57-015449 | 1/1982 |
| JP | 60-015995 | 1/1985 |
| JP | 04-206599 | 7/1992 |

* cited by examiner

*Primary Examiner* — Gregory D Thompson
(74) *Attorney, Agent, or Firm* — Westerman, Hattori, Daniels & Adrian, LLP

(57) ABSTRACT

A board unit comprises a board, a heat generating component mounted on a front surface of the board, a first heat transfer plate whose inner surface faces the front surface of the board and is received by the heat generating component, a heat insulating material that is superimposed on an outer surface of the first heat transfer plate and that insulates heat dissipation, a second heat transfer plate that continues to the first heat transfer plate and that defines a heat conducting surface and a heat receiver that is received by the heat conducting surface of the second heat transfer plate and that defines a flow path of a coolant.

14 Claims, 7 Drawing Sheets

BOARD UNIT AND ELECTRONIC APPARATUS

CROSS-REFERENCE TO RELATED APPLICATION

This application is based upon and claims the benefit of priority from the prior Japanese Patent Application No. 2008-75622 filed on Mar. 24, 2008, the entire contents of which are incorporated herein by reference.

FIELD

The present invention relates to a board unit including a heat generating component.

BACKGROUND

For example, a system board unit is incorporated in a server computer. The system board unit includes a system board and related casing and fixture components. A plurality of LSI (Large-Scale Integration) packages and a plurality of memory boards (memory cards) are mounted on the system board. The respective memory boards are placed on the system board in an upright state. Airflow paths are provided between the respective memory boards. The convection of airflow along a surface of the system board removes heat from the memory boards, as well as other heat generating components. The air of increased temperature is emitted to the space outside the server computer. Accordingly, the memory boards and other heat generating components are cooled down.

SUMMARY

A board unit comprises a board, a heat generating component mounted on a front surface of the board, a first heat transfer plate whose inner surface faces the front surface of the board and is received by the heat generating component, a heat insulating material that is superimposed on an outer surface of the first heat transfer plate and that insulates heat dissipation, a second heat transfer plate that continues to the first heat transfer plate and that defines a heat conducting surface and a heat receiver that is received by the heat conducting surface of the second heat transfer plate and that defines a flow path of a coolant.

DETAILED DESCRIPTION OF THE EMBODIMENTS

Hereinafter, an embodiment of the present invention is described with reference to the attached drawings.

Figure 1:
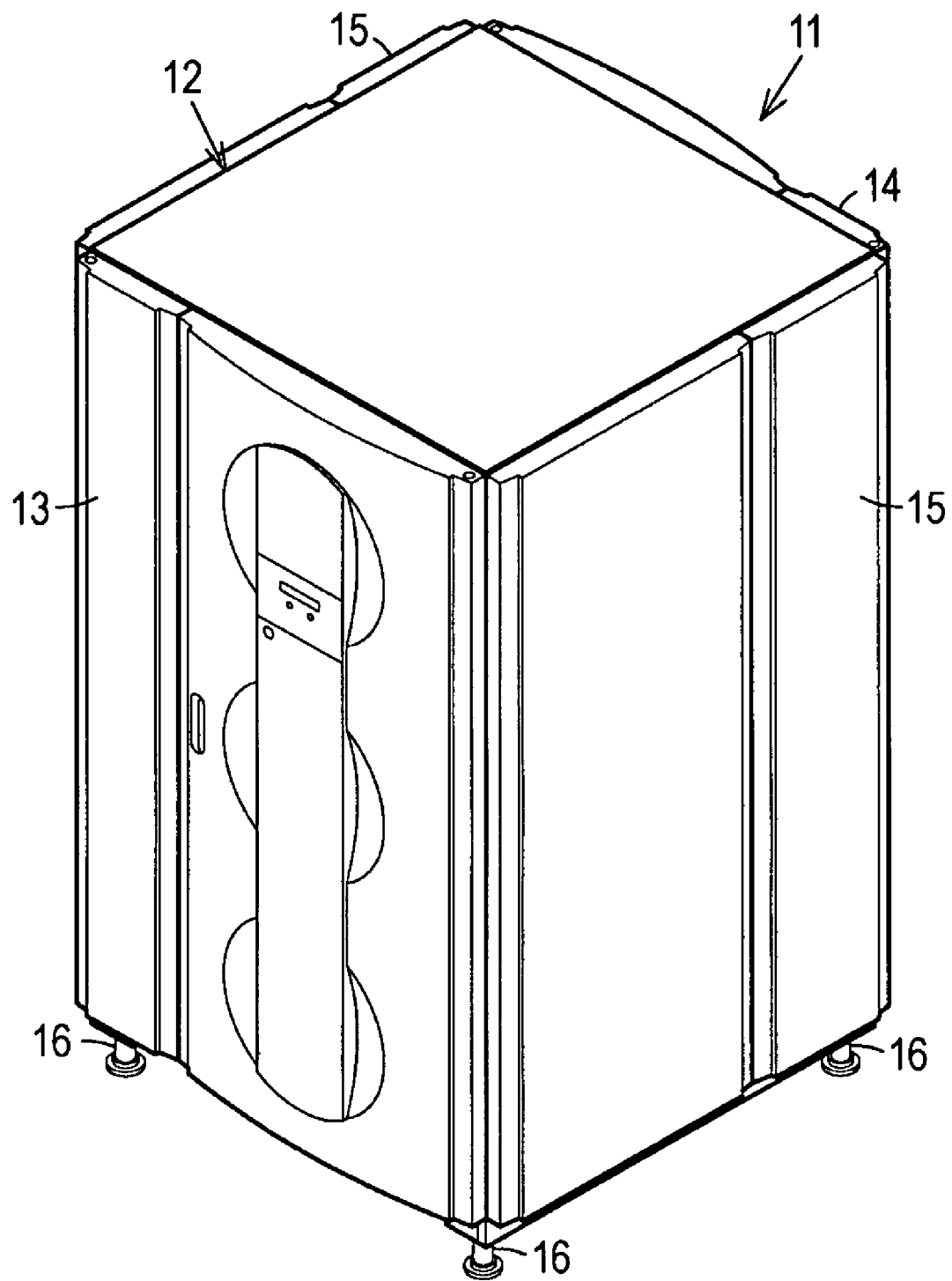
FIG. 1 is a perspective view schematically illustrating an appearance of a specific example of an electronic apparatus according to the present invention, that is, a cabinet of the server computer.

FIG. 1 schematically illustrates the appearance of a specific example of an electronic apparatus according to the present invention, that is, a server computer 11. The server computer 11 includes an outer casing (cabinet) 12. A front door 13 is placed on a front surface of the outer casing 12. A back door 14 is placed on a back surface of the outer casing 12. The front and back surfaces of the outer casing 12 are opened on the basis of opening/closing of the front door 13 and the back door 14. Decorated covers 15 or the like are attached on side surfaces of the outer casing 12. The outer casing 12 is supported by four supporting legs 16 or the like. The supporting legs 16 allow a bottom surface of the outer casing 12 to be placed at a predetermined height from a floor surface.

Figure 2:
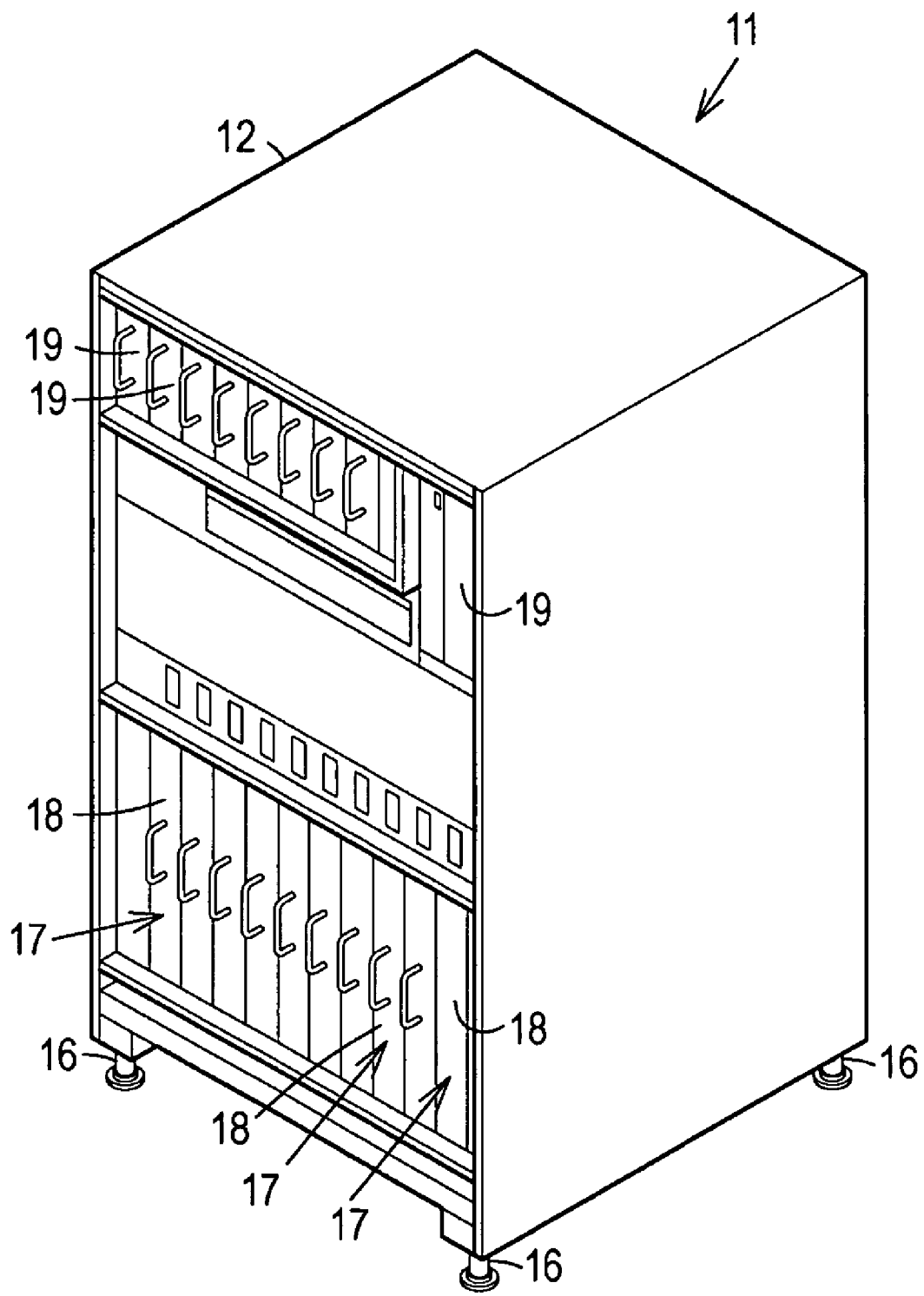
FIG. 2 is a perspective view schematically illustrating an appearance of the specific example of the electronic apparatus according to the present invention, that is, the server computer incorporated with a plurality of system board units.

As illustrated in FIG. 2, a plurality of system board units 17 are mounted on a lower stage of the outer casing 12. Each of the system board units 17 includes a housing 18. A system board (described below) is incorporated into an inner space of the housing 18. The system board is upright in the vertical direction orthogonal to the floor surface. Those system board units 17 are inserted through a front slot of the outer casing 12. A back panel is accommodated in the outer casing 12. When the system board units 17 are inserted through the slot, connectors placed at rear ends of the system board units 17 are connected to the back panel.

Various units 19 including input/output units, fan units, and power supply units are mounted on middle and upper stages of the outer casing 12. The fan unit can generate airflow in the outer casing 12 on the basis of rotation of an axial fan or the like. The air flows in a vertical direction from the bottom surface toward the upper surface of the outer casing 12. External air is introduced from the bottom surface of the outer casing 12. Such airflow removes heat from the system board units 17, as well as other heat generating components. A commercial outlet or the like is connected to the power supply unit through a power supply cable. The power supply unit supplies power to the system board units 17.

Figure 3:
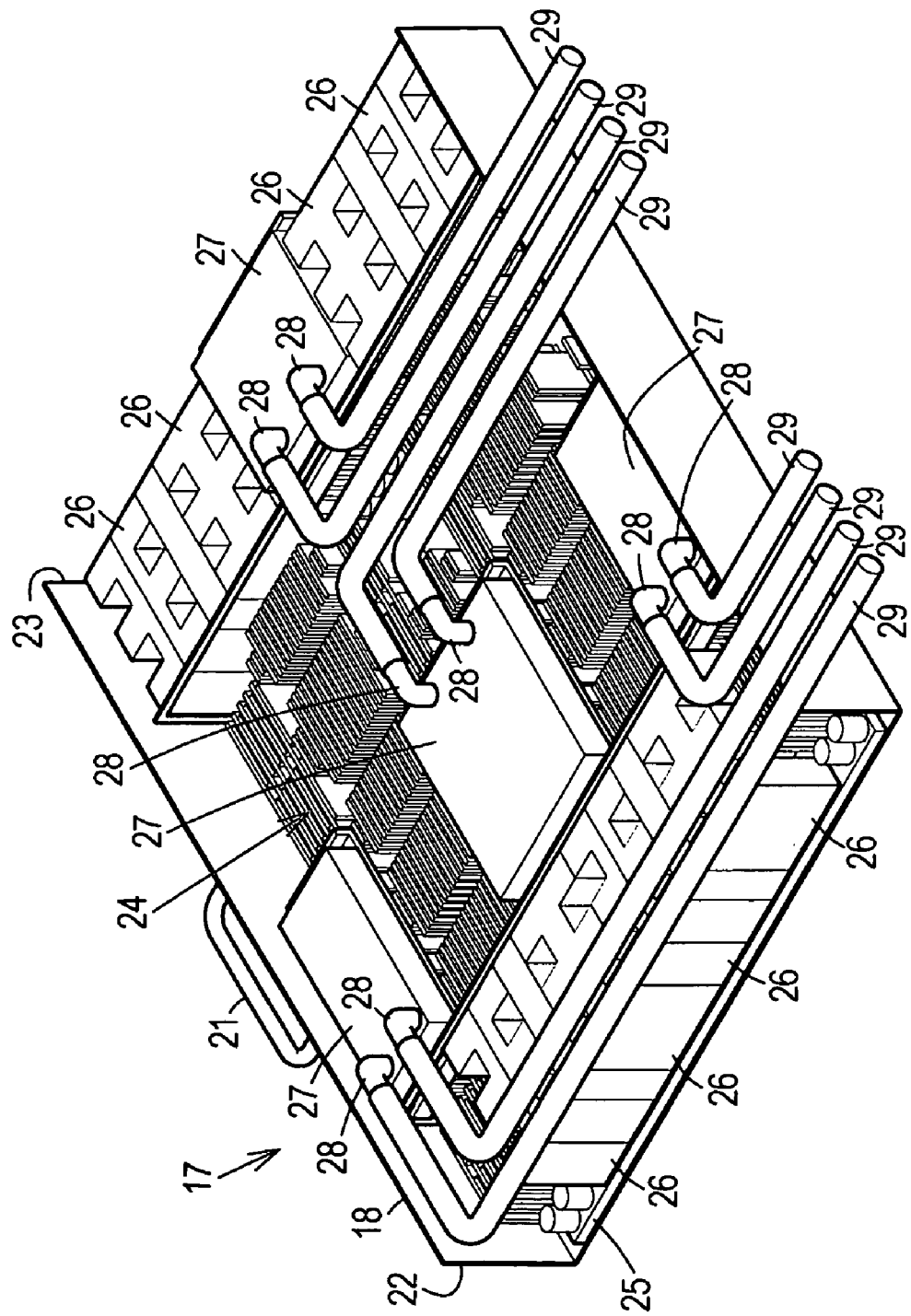
FIG. 3 is a perspective view schematically illustrating a configuration of a system board unit.

FIG. 3 is a perspective view schematically illustrating a configuration of the system board unit 17. In the system board unit 17, the housing 18 defines a rectangular-parallelepiped inner space. The housing 18 is made of a metallic plate, such as a stainless steel plate, for example. A handle 21 is attached to a side plate on a front side of the housing 18. A manager can draw the system board unit 17 from the server computer 11 by holding the handle 21. When the system board unit 17 is inserted through the slot of the outer casing 12, an upright posture of the housing 18 is established in the vertical direction.

An inlet 22 is formed on a bottom surface of the upright housing 18. Airflow is introduced through the inlet 22. The inlet 22 faces the floor surface in the upright housing 18. Likewise, an outlet 23 is formed on an upper surface of the housing 18. Air is emitted through the outlet 23. In this way, an airflow path from the inlet 22 toward the outlet 23 is established. One side surface of the housing 18 is open. On this side surface, the system board unit 17 faces a bottom plate of the housing 18 of the adjacent system board unit 17. A predetermined gap is defined between the side surface and the bottom plate.

A printed board unit 24 is accommodated in an inner space of the housing 18. The printed board unit 24 includes a system board 25. The system board 25 is fixed to the bottom plate of the housing 18. A plurality of LSI (Large-Scale Integration) packages (not illustrated) are mounted on a front surface of the system board 25. In each of the LSI packages, a CPU (Central Processing Unit) chip is mounted on a compact ceramic substrate, for example. The CPU chip executes various operations on the basis of application software and data that are temporarily stored in a memory or the like.

Heat sinks 26 are received on the LSI packages. Each of the heat sinks 26 includes a flat-plate base, that is, a heat receiving unit, and a plurality of fins attached on the base in a vertical direction. Airflow paths extending in the same direction are provided between adjacent fins. The airflow paths extend from the inlet 22 toward the outlet 23. Also, a plurality of electronic circuit elements including a DC-DC converter and a memory board are mounted on the front surface of the system board 25 outside the LSI packages. Box-shaped heat receivers 27 are received on the electronic circuit elements.

Each of the heat receivers 27 is made of a heat-conducting metallic material, such as aluminum. As described below, heat of the electronic circuit elements transmits to the heat receivers 27. As a result, the heat receivers 27 remove the heat of the electronic circuit elements. A coolant flow path is established in an inner space of the heat receivers 27. As for coolant, propylene glycol antifreeze liquid may be used, for example. The heat of the electronic circuit elements is removed through the coolant. A pair of nipples 28 serving as an inlet and an outlet of the coolant are integrated to each of the heat receivers 27. One end of an elastic tube 29 connects to each nipple 28. The elastic tube 29 is made of a flexible elastic resin material, such as rubber.

Figure 4:
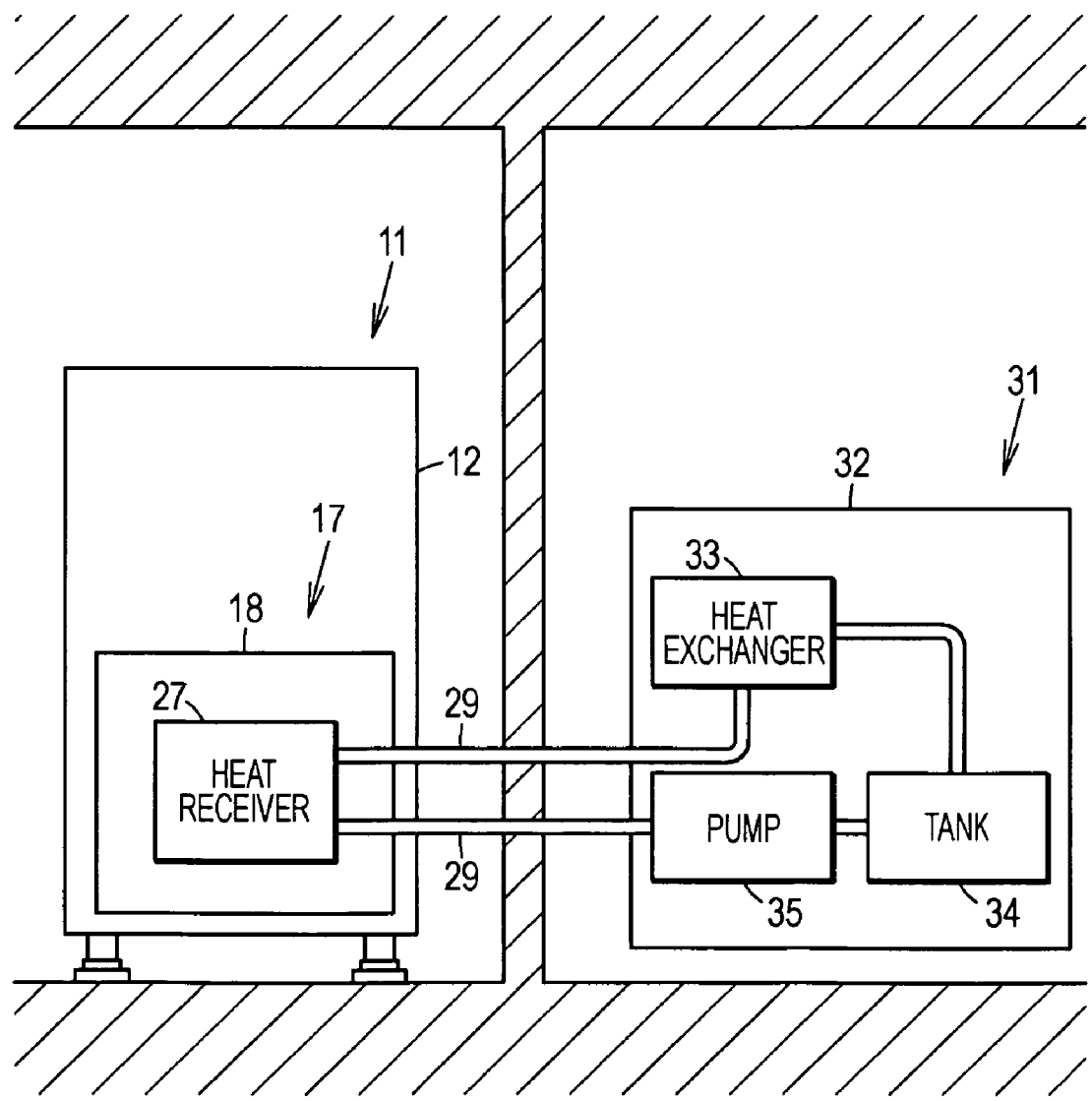
FIG. 4 is a block diagram schematically illustrating a configuration of a liquid cooling unit.

As illustrated in FIG. 4, the server computer 11 includes a liquid cooling unit 31 individually connected to the respective heat receivers 27. In the liquid cooling unit 31, a circulation path of coolant that takes a round from the heat receiver 27 is established. The liquid cooling unit 31 includes a chiller 32 that is placed in a chamber different from a chamber where the server computer 11 is placed. The chiller 32 includes a heat exchanger 33 connected to the heat receiver 27 downstream of the heat receiver 27. The heat exchanger 33 is exposed to airflow of a fan (not illustrated). Heat of the coolant is dissipated by the airflow. The heat exchanger 33 removes heat from the coolant. As a result, the heat of the heat exchanger 33 is dissipated to the air in the other chamber.

A tank 34 is incorporated in the circulation path. The tank 34 connects to the heat exchanger 33 in the downstream of the heat exchanger 33. The tank 34 stores the coolant in the circulation path. A pump 35 is incorporated in the circulation path. The pump 35 connects to the tank 34 in the downstream of the tank 34. The heat receiver 27 is connected in the downstream of the pump 35. A piezoelectric pump is used as the pump 35, for example. The coolant is supplied from the tank 34 to the pump 35 by the action of the pump 35. Likewise, the coolant is discharged from the pump 35 toward the heat receiver 27. In this way, the pump 35 allows the coolant to circulate in the circulation path.

Figure 5:
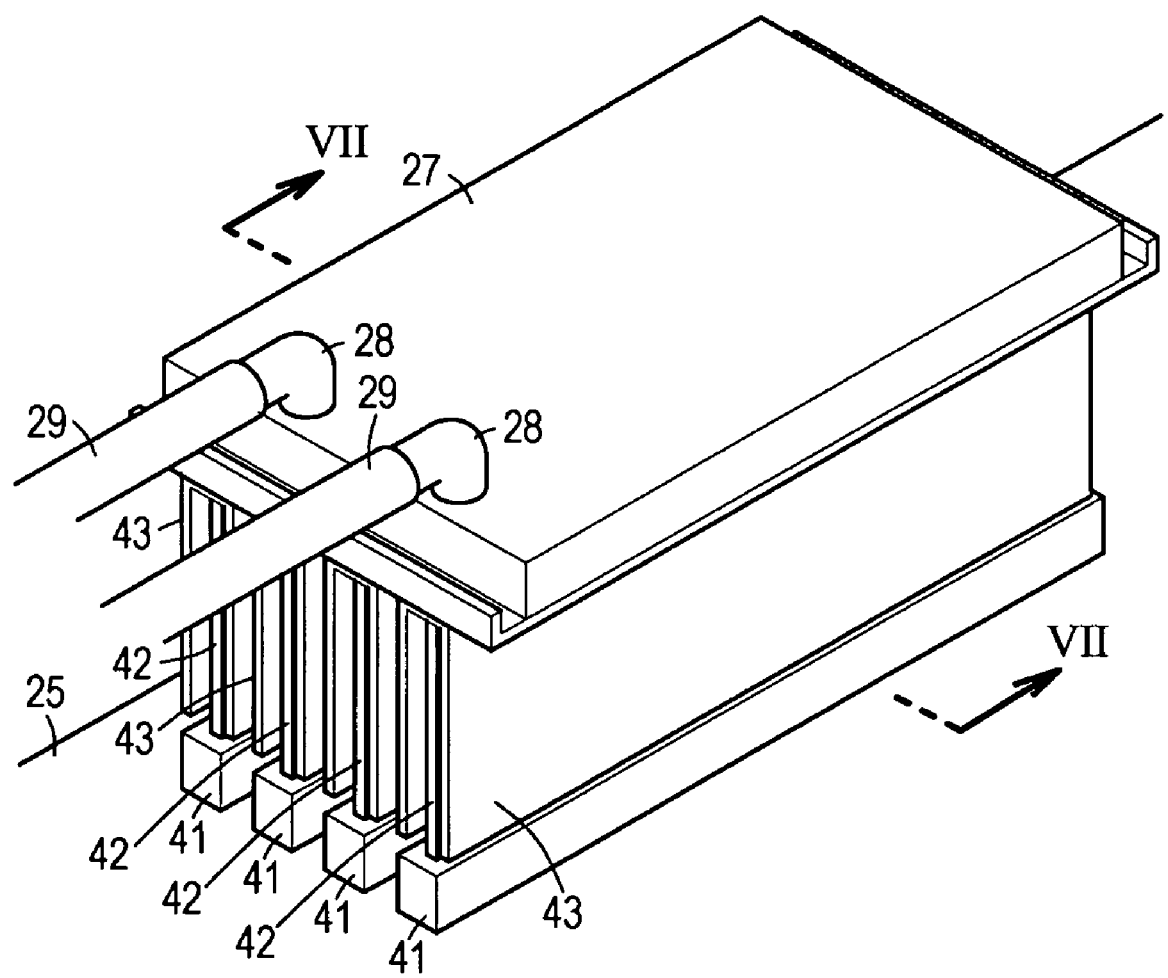
FIG. 5 is a partial enlarged perspective view schematically illustrating a configuration of a board (memory card) unit according to an embodiment of the present invention.

As illustrated in FIG. 5, a plurality of connectors 41 are mounted on the system board 25. The connectors 41 stand on the front surface of the system board 25 in the vertical direction and are mutually parallel at predetermined intervals. A memory board 42 is inserted to each of the connectors 41. The connector 41 constitutes a so-called card edge connector. The memory board 42 constitutes a so-called DIMM (Dual Inline Memory Module). The respective memory boards 42 are electrically connected to the system board 25 by the action of the connectors 41. The memory boards 42 are held in a vertical posture with respect to the system board 25.

Figure 6:
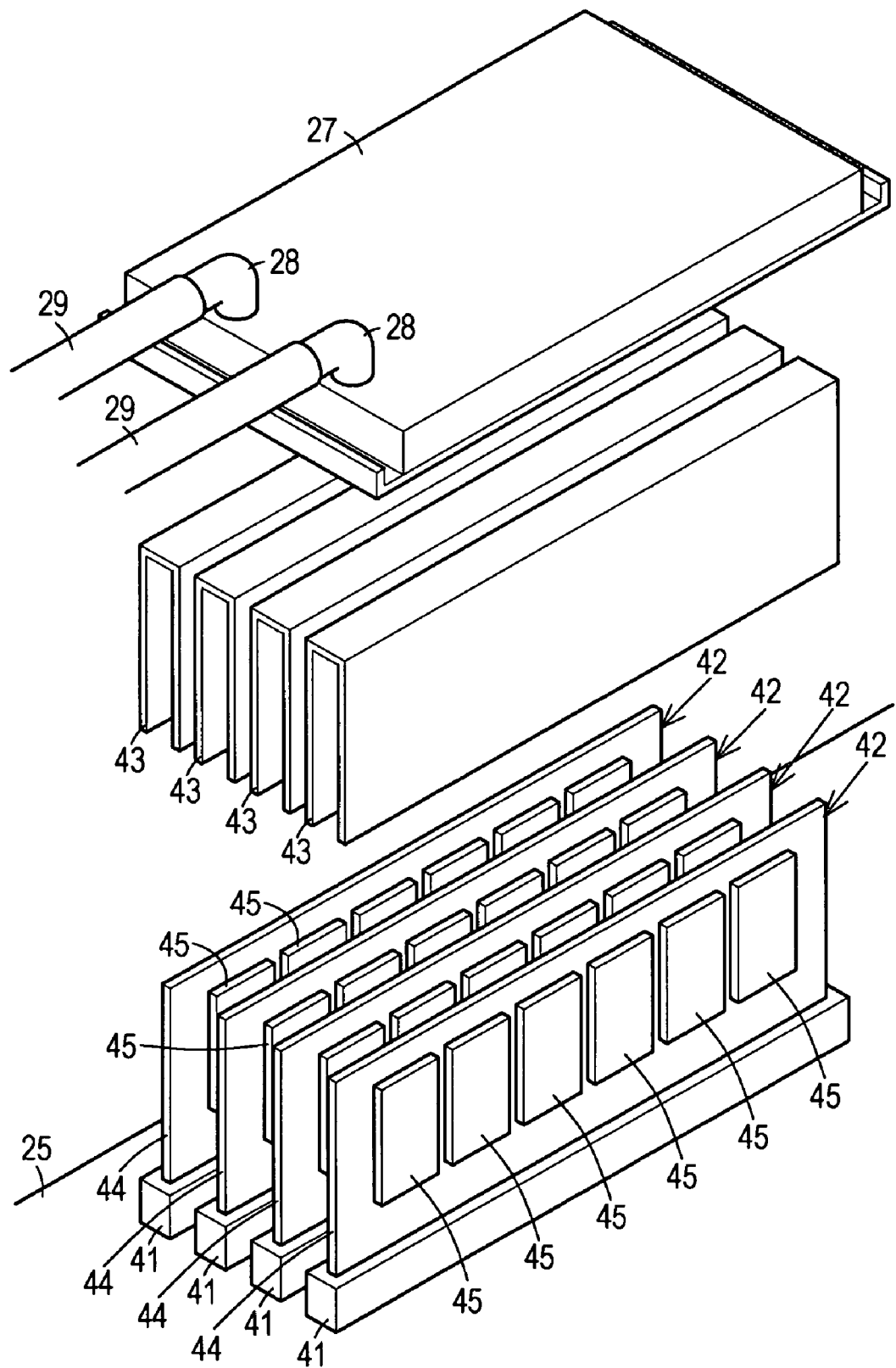
FIG. 6 is a partial enlarged exploded perspective view schematically illustrating a configuration of a board (memory card) unit according to an embodiment of the present invention.

With reference to FIG. 6, also, a heat transfer member 43 is attached to each of the memory boards 42. The above-described heat receiver 27 is received on the respective heat transfer members 43. Each of the heat transfer members 43 is made of a heat-conducting metallic material, such as copper or aluminum. Each memory board 42 includes a printed board 44. Heat generating components such as memory chips 45 are mounted on front and rear surfaces of the printed board 44. Each of the memory chips 45 is electrically connected to the above-described LSI package via the connector 41. Accordingly, the memory boards 42 function as a main memory.

Figure 7:
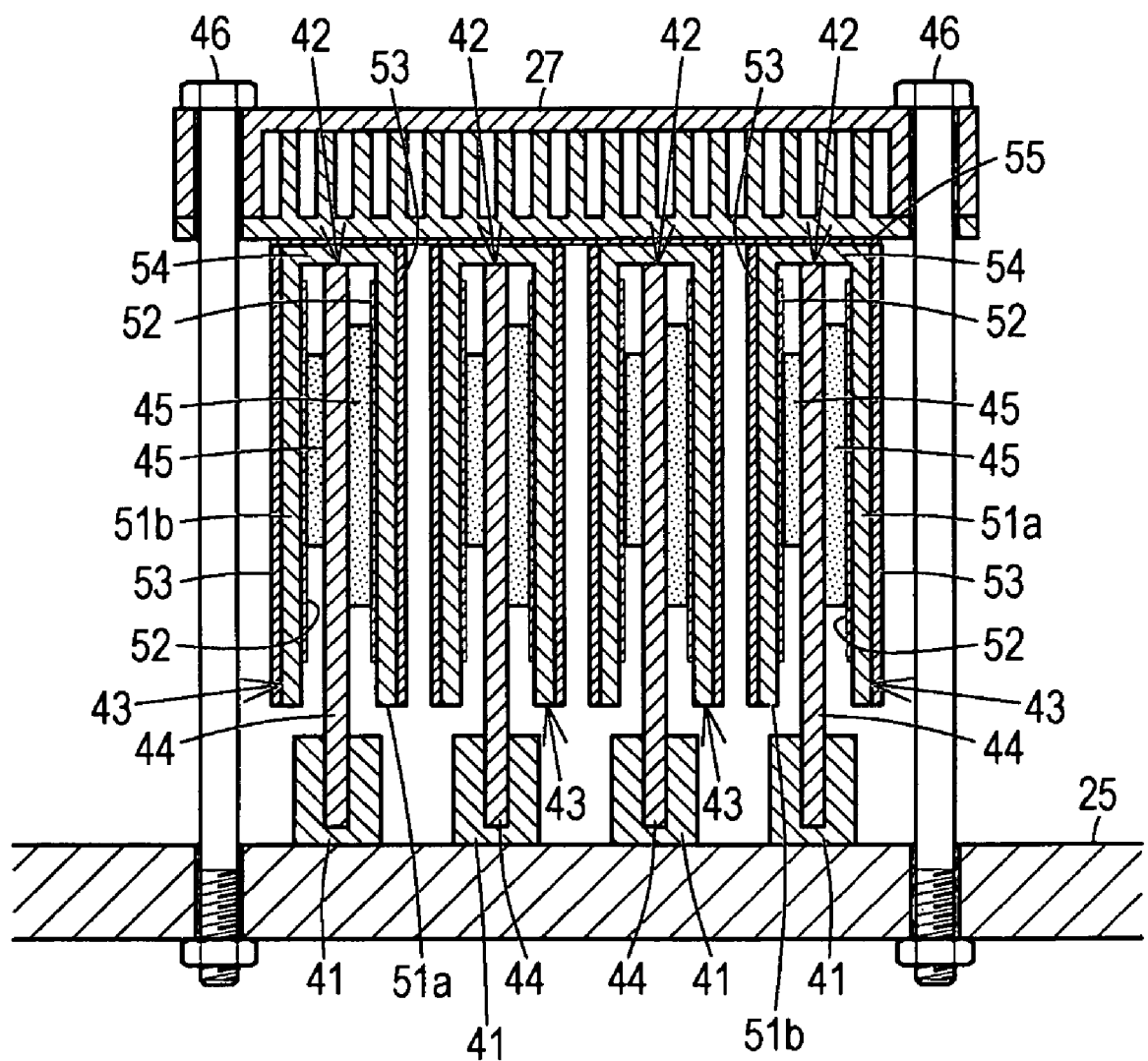
FIG. 7 is a cross-sectional view taken along the line VII-VII in FIG. 5.

As illustrated in FIG. 7, the heat transfer members 43 are adjacent to each other with a predetermined gap therebetween. Each of the heat transfer members 43 includes first heat transfer plates 51a and 51b. An inner surface of the first heat transfer plate 51a faces a front surface of the printed board 44. Likewise, an inner surface of the first heat transfer plate 51b faces a rear surface of the printed board 44. The inner surface of the first heat transfer plate 51a is received on the memory chips 45 on the front surface of the printed board 44. Likewise, the inner surface of the first heat transfer plate 51b is received on the memory chips 45 on the rear surface of the printed board 44. The first heat transfer plates 51a and 51b extend along a virtual plane orthogonal to the front surface of the system board 25. The first heat transfer plates 51a and 51b extend parallel with each other.

Heat conducting sheets 52 are sandwiched between the inner surfaces of the first heat transfer plates 51a and 51b and the memory chips 45, respectively. Each of the heat conducting sheets 52 may be at least in contact with an entire front surface of the memory chips 45. Here, the heat conducting sheets 52 extend over the front surfaces of the memory chips 45. By the action of the heat conducting sheets 52, heat efficiently transmits from the memory chips 45 to the first heat transfer plates 51a and 51b. As a result, the first heat transfer plates 51a and 51b remove heat from the memory chips 45. A thermal sheet is used as the heat conducting sheet 52, for example. The heat conducting sheet 52 has a thickness of about 0.2 to 0.3 mm, for example.

On the other hand, heat insulating sheets 53 are pasted on outer surfaces of the first heat transfer plates 51a and 51b. The heat insulating sheets 53 block heat transmission. The heat insulating sheets 53 may be pasted on the entire outer surfaces of the first heat transfer plates 51a and 51b. An adhesive or the like is used for the pasting. A material such as rubber or resin is used for the heat insulating sheets 53. Each of the heat insulating sheets 53 has a thickness of about 0.2 to 0.3 mm, for example. By the action of the heat insulating sheets 53, emission of heat of the heat transfer members 43 from the outer surfaces of the first heat transfer plates 51a and 51b toward the inner space of the housing 18 can be prevented.

Each of the heat transfer members 43 includes a second heat transfer plate 54 to mutually connect upper ends of the first heat transfer plates 51a and 51b. The second heat transfer plate 54 continues to the first heat transfer plates 51a and 51b on the basis of integrated molding. The second heat transfer plate 54 extends in parallel with the front surface of the system board 25. An inner surface of the second heat transfer plate 54 may be received by an upper end of the printed board 44. Here, in the respective heat transfer members 43 attached to the respective memory boards 42, the heights of the outer surfaces, i.e., heat dissipating surfaces, of the second heat transfer plates 54 are equal to each other. The heat dissipating surfaces of the respective second heat transfer plates 54 extend along a single virtual plane.

The bottom surface of the above-described heat receiver 27 is received by the heat conducting surfaces of the respective second heat transfer plates 54. A common heat conducting sheet 55 is sandwiched between the upper surfaces of the second heat transfer plates 54 and the bottom surface of the heat receiver 27. The heat conducting sheet 55 has the same configuration as that of the above-described heat conducting sheet 52. The action of the heat conducting sheet 55 allows the heat of the second heat transfer plates 54 to be efficiently transmitted to the heat receiver 27. The heat receiver 27 may be fixed to the system board 25 by using four screws 46, for example. The screws 46 may be placed at the four corners of the heat receiver 27, for example. A refrigerant flow path is formed in an inner space of the heat receiver 27. Here, the memory boards 42, the heat transfer members 43, and the heat receiver 27 constitute the board unit according to the present embodiment.

In the above-described server computer 11, external air is introduced from the bottom surface of the outer casing 12 via the fan unit while the system board units 17 operate, for example. In each of the system board units 17, air flows from the inlet 22 toward the outlet 23. The CPU chips generate heat during operation. The heat of the CPU chips is transmitted to the heat sinks 26. The heat is removed from the heat sinks 26 in accordance with airflow. The air with heat is emitted through the outlet 23. Then, the air with an increased temperature is emitted to an outer space of the outer casing 12. In this way, the LSI packages are cooled down.

On the other hand, the action of the chiller 32 placed outside the outer casing 12 causes a flow of coolant in the circulation path in the liquid cooling unit 31. The coolant flows in the flow path in the heat receiver 27. The memory chips 45 generate heat during operation. The heat of the memory chips 45 transmits via the heat conducting sheets 52 to the first heat transfer plates 51a and 51b. Since the heat insulating sheets 53 are pasted on the outer surfaces of the first heat transfer plates 51a and 51b, heat emission from the first heat transfer plates 51a and 51b to the inner space of the housing 18 is prevented. As a result, the heat of the memory chips 45 transmits from the first heat transfer plates 51a and 51b to the second heat transfer plates 54.

The action of the heat conducting sheet 55 causes heat to transmit from the respective second heat transfer plates 54 to the heat receiver 27. The heat of the heat receiver 27 transmits to the coolant in the flow path. In this way, the memory chips 45 are cooled down. The coolant flows from the heat receiver 27 into the heat exchanger 33 in the chiller 32. The heat exchanger 33 allows heat to be emitted to the air in the other chamber. The coolant is cooled down. The coolant flows into the tank 34. Then, the coolant flows from the tank 34 to the pump 35. The action of the pump 35 causes the coolant to be ejected toward the heat receiver 27. In this way, circulation of the coolant is repeated in the circulation path. The memory chips 45 are efficiently cooled down.

In the above-described system board units 17, the heat of the memory chips 45 transmits to the first heat transfer plates 51a and 51b. Since the heat insulating sheets 53 are pasted on the outer surfaces of the first heat transfer plates 51a and 51b, heat emission from the outer surfaces of the first heat transfer plates 51a and 51b to the inner space of the housing 18 is prevented. As a result, the air that flows from the inlet 22 toward the outlet 23 in the housing 18 can efficiently remove heat from the LSI packages. On the other hand, heat transmits from the first heat transfer plates 51a and 51b to the heat receiver 27 via the second heat transfer plates 54. In this way, the memory chips 45 are efficiently cooled down.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

The invention claimed is:

1. A board unit comprising:
   a board;
   a heat generating component mounted on a front surface of the board;
   a first heat transfer plate whose inner surface faces the front surface of the board and is in thermal conduction with the heat generating component;
   a heat insulating material that is superimposed on an outer surface of the first heat transfer plate and that insulates heat dissipation;
   a second heat transfer plate that contacts to the first heat transfer plate and that defines a heat conducting surface; and
   a heat receiver that is in thermal conduction with the heat conducting surface of the second heat transfer plate and is exposed to a flow path of a coolant.

2. The board unit according to claim 1, wherein a heat conducting material is sandwiched between the heat generating component and the first heat transfer plate.

3. The board unit according to claim 1, wherein a heat conducting material is sandwiched between the second heat transfer plate and the heat receiver.

4. The board unit according to claim 1, further comprising:
   a heat generating component mounted on a rear surface of the board;
   a third heat transfer plate whose inner surface faces the rear surface of the board and is in thermal conduction with the heat generating component, the third heat transfer plate contacting to the second heat transfer plate; and
   a second heat insulating material that is superimposed on an outer surface of the third heat transfer plate and that insulates heat dissipation.

5. The board unit according to claim 4, wherein a heat conducting material is sandwiched between the heat generating component on the rear surface of the board and the third heat transfer plate.

6. The board unit according to claim 1, wherein the heat generating component includes a memory chip.

7. An electronic apparatus comprising:
   a board;
   a heat generating component mounted on a front surface of the board;
   a first heat transfer plate whose inner surface faces the front surface of the board and is in thermal conduction with the heat generating component;
   a heat insulating material that is superimposed on an outer surface of the first heat transfer plate and that insulates heat dissipation;
   a second heat transfer plate that contacts to the first heat transfer plate and that defines a heat conducting surface; and
   a heat receiver that is in thermal conduction with the heat conducting surface of the second heat transfer plate and is exposed to a flow path of a coolant.

8. A board unit comprising:
   a plurality of boards arranged in parallel to each other;
   a plurality of heat generating components mounted on front surfaces of the respective boards;

a plurality of first heat transfer plates wherein an inner surface of each of the first heat transfer plates faces each of the front surfaces of the respective boards and are in thermal conduction with each of the respective heat generating components;

a plurality of heat insulating materials that are superimposed on outer surfaces of the respective first heat transfer plates and that insulate heat dissipation;

a plurality of second heat transfer plates that contact to the respective first heat transfer plates and that define heat conducting surfaces; and a heat receiver that is in thermal conduction with the heat conducting surfaces of all the second heat transfer plates and is exposed to a flow path of a coolant.

9. An electronic apparatus comprising:

a plurality of boards arranged in parallel to each other;

a plurality of heat generating components mounted on front surfaces of the respective boards;

a plurality of first heat transfer plates wherein an inner surface of each of the first heat transfer plates faces each of the front surfaces of the respective boards and are in thermal conduction with each of the respective heat generating components;

a plurality of heat insulating materials that are superimposed on outer surfaces of the respective first heat transfer plates and that insulate heat dissipation;

a plurality of second heat transfer plates that contact to the respective first heat transfer plates and that define heat conducting surfaces; and a heat receiver that is in thermal conduction with the heat conducting surfaces of all the second heat transfer plates and is exposed to a flow path of a coolant.

10. The board unit according to claim 2, wherein a heat conducting material is sandwiched between the second heat transfer plate and the heat receiver.

11. The board unit according to claim 2, wherein the heat generating component includes a memory chip.

12. The board unit according to claim 3, wherein the heat generating component includes a memory chip.

13. The board unit according to claim 4, wherein the heat generating component includes a memory chip.

14. The board unit according to claim 5, wherein the heat generating component includes a memory chip.

* * * * *